US009620684B2

(12) United States Patent
Katoh et al.

(10) Patent No.: US 9,620,684 B2
(45) Date of Patent: Apr. 11, 2017

(54) LED LIGHTING APPARATUS AND METHOD FOR MANUFACTURING THE SAME

(71) Applicants: Citizen Electronics Co., Ltd., Yamanashi (JP); CITIZEN WATCH CO., LTD., Tokyo (JP)

(72) Inventors: Tatsuya Katoh, Ebina (JP); Sadato Imai, Yamanashi (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 14/686,909

(22) Filed: Apr. 15, 2015

(65) Prior Publication Data

US 2015/0311403 A1  Oct. 29, 2015

(30) Foreign Application Priority Data

Apr. 23, 2014  (JP) ................. 2014-089301

(51) Int. Cl.

| | |
|---|---|
| H01L 33/50 | (2010.01) |
| H01L 33/48 | (2010.01) |
| H01L 33/60 | (2010.01) |
| H01L 33/62 | (2010.01) |
| H01L 25/075 | (2006.01) |
| H01L 33/64 | (2010.01) |

(52) U.S. Cl.
CPC ........... *H01L 33/486* (2013.01); *H01L 33/50* (2013.01); *H01L 33/60* (2013.01); *H01L 33/62* (2013.01); H01L 25/0753 (2013.01); H01L 33/641 (2013.01); H01L 2224/45144 (2013.01); H01L 2224/48095 (2013.01); H01L 2224/73265 (2013.01); *H01L 2933/0033* (2013.01); *H01L 2933/0041* (2013.01); *H01L 2933/0066* (2013.01)

(58) Field of Classification Search
CPC ....... H01L 33/486; H01L 33/50; H01L 33/62; H01L 33/60; H01L 2224/45144; H01L 2224/73265; H01L 2933/0041
See application file for complete search history.

(56) References Cited

U.S. PATENT DOCUMENTS

2011/0278624 A1* 11/2011 Nam .................... H01L 33/486
257/98

FOREIGN PATENT DOCUMENTS

JP  2007-109701 A  4/2007

* cited by examiner

*Primary Examiner* — David Vu
(74) *Attorney, Agent, or Firm* — RATNERPRESTIA

(57) ABSTRACT

To provide an LED lighting apparatus and a method for manufacturing the same that can improve the bonding strength between an aluminum substrate and a printed wiring substrate. An LED lighting apparatus and a method for manufacturing the same, the LED lighting apparatus includes an aluminum substrate, a plurality of reflectivity-enhanced layers formed on the aluminum substrate, an LED device bonded on said plurality of reflectivity-enhanced layers, a printed wiring substrate bonded onto a region on the aluminum substrate other than a region where the plurality of reflectivity-enhanced layers are formed, a wire for connecting between the printed wiring substrate and the LED device, a frame member formed so as to surround said LED device, and a phosphor resin deposited over a region inside the frame member.

2 Claims, 4 Drawing Sheets

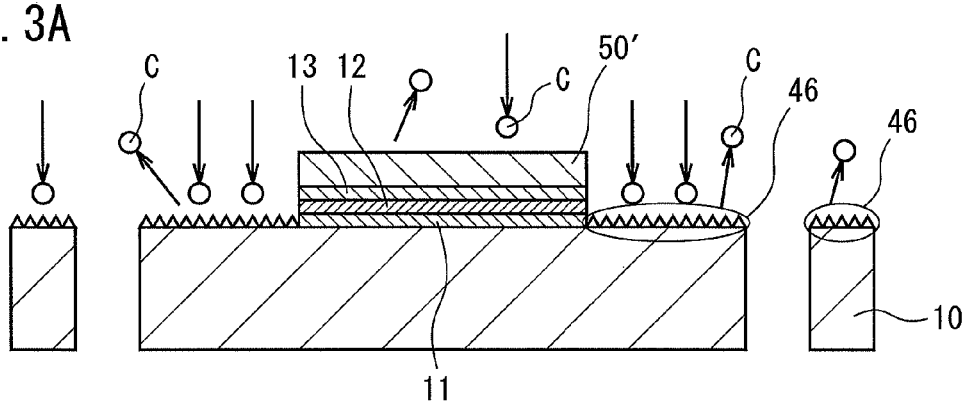
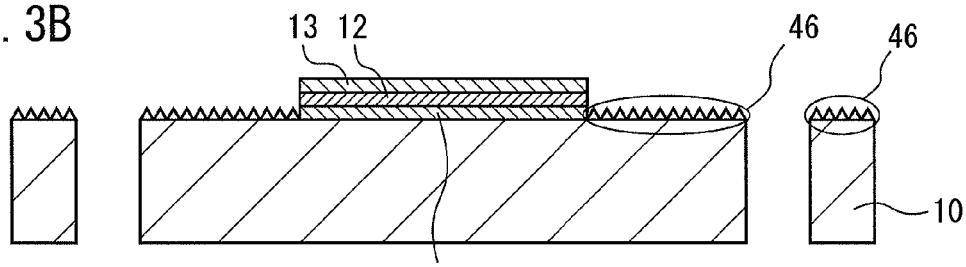
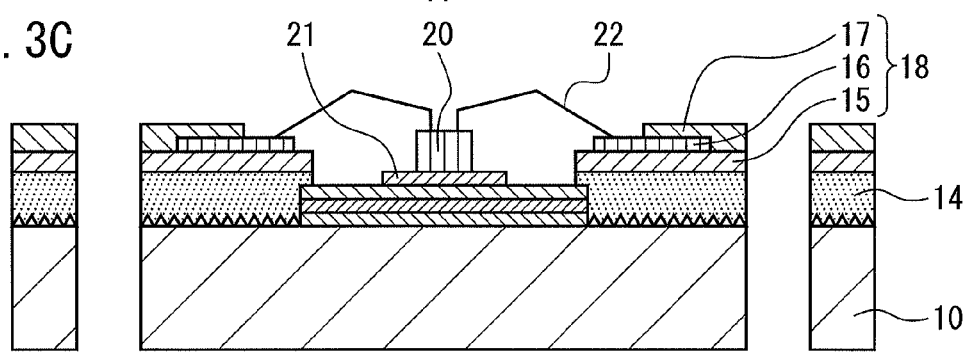
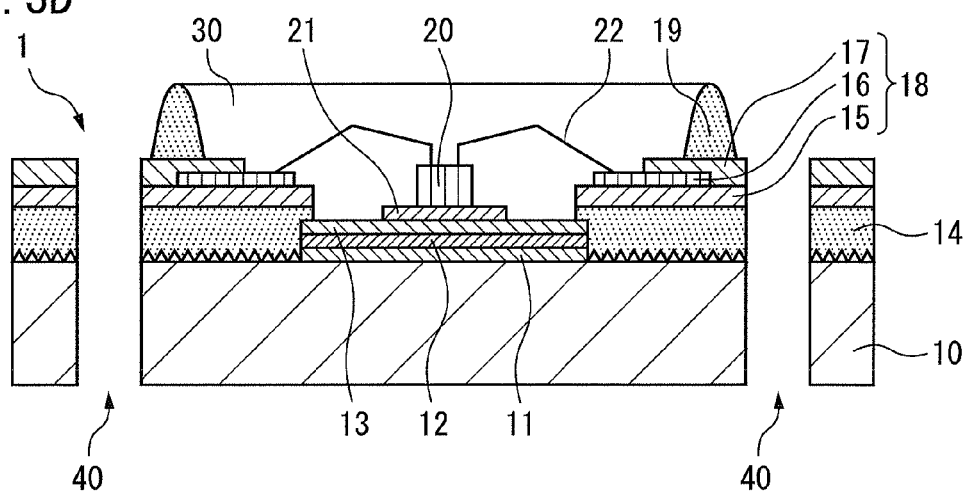

LED LIGHTING APPARATUS AND METHOD FOR MANUFACTURING THE SAME

CROSS-REFERENCES TO RELATED APPLICATION

This application is a new U.S. patent application that claims benefit of JP 2014-89301, filed on Apr. 23, 2014, the entire content of JP 2014-89301 is hereby incorporated by reference.

TECHNICAL FIELD

The present invention relates to an LED lighting apparatus and a method for manufacturing the same, and more specifically to an LED lighting apparatus constructed by mounting an LED device onto an aluminum substrate and a method for manufacturing such an LED lighting apparatus.

BACKGROUND ART

In recent years, LED devices as semiconductor devices have come into wide use in illumination and other applications due to their long life and excellent driving characteristics as well as their compact size, good luminous efficacy, and crisp and bright color emission.

To construct a lighting apparatus for illumination purposes, it is known to apply specular treatment such as vapor deposition or anodizing treatment to an aluminum surface and then mount an LED device thereon so that the light emitted from the LED device can be reflected efficiently (for example, refer to Japanese Unexamined Patent Publication No. 2007-109701).

SUMMARY

However, there has been the problem that when a wiring substrate, electrodes, etc., that are connected to the LED devices by being bonded to the specular surface by means of an adhesive sheet or the like, the wiring substrate, etc., may delaminate at the layers formed by the specular treatment, because the adhesion between the layers formed by the specular treatment is insufficient.

There has also been the problem that when the aluminum substrate is subjected to thermal expansion and thermal shrinkage due to changes in ambient temperature, interlayer delamination may occur between the layers formed by the specular treatment and, in this case also, the wiring substrate, etc., may become delaminated.

Accordingly, it is an object of the present invention to provide an LED lighting apparatus and a method for manufacturing the same that can solve the above problems.

It is also an object of the present invention to provide an LED lighting apparatus and a method for manufacturing the same that can improve the bonding strength between an aluminum substrate and a printed wiring substrate.

An LED lighting apparatus includes an aluminum substrate, a plurality of reflectivity-enhanced layers formed on the aluminum substrate, an LED device bonded on the plurality of reflectivity-enhanced layers, a printed wiring substrate bonded onto a region on the aluminum substrate other than a region where the plurality of reflectivity-enhanced layers are formed, a wire for connecting between the printed wiring substrate and the LED device, a frame member formed so as to surround the LED device, and a phosphor resin deposited over a region inside the frame member.

Preferably, in the LED lighting apparatus, the printed wiring substrate is bonded on a roughened surface region formed outside the region where the plurality of reflectivity-enhanced layers are formed.

Preferably, in the LED lighting apparatus, the plurality of reflectivity-enhanced layers comprise an adhesive layer, a reflective layer, and an enhanced reflectivity layer.

A method for manufacturing an LED lighting apparatus includes the steps of forming a mask on an aluminum substrate on which a plurality of reflectivity-enhanced layers are formed, forming a roughened surface region on the aluminum substrate by removing the plurality of reflectivity-enhanced layers everywhere except where the mask is formed, bonding a printed wiring substrate on the roughened surface region, bonding an LED device on the plurality of reflectivity-enhanced layers from which the mask has been removed; connecting the LED device to the printed wiring substrate by a wire, and depositing a phosphor resin over a region inside a frame member formed so as to surround the LED device.

According to the LED lighting apparatus and the method for manufacturing the same as stated above, the printed wiring substrate does not become delaminated from the aluminum substrate, and thus, an LED lighting apparatus with high reliability can be provided.

BRIEF DESCRIPTION OF THE DRAWINGS

Other features and advantageous of the present lighting apparatus will be apparent from the ensuing description, taken in conjunction with the accompanying drawings, in which:

FIG. 3A is a diagram (part 2) for explaining a manufacturing process for the LED lighting apparatus 1.

FIG. 3B is a diagram (part 2) for explaining a manufacturing process for the LED lighting apparatus 1.

FIG. 3C is a diagram (part 2) for explaining a manufacturing process for the LED lighting apparatus 1.

FIG. 3D is a diagram (part 2) for explaining a manufacturing process for the LED lighting apparatus 1.

DESCRIPTION

An LED lighting apparatus according to the present invention and a method for manufacturing the same will be described below with reference to the drawings. It should, however, be noted that the technical scope of the present invention is not limited by any particular embodiment described herein but extends to the inventions described in the appended claims and their equivalents.

Figure 1A:
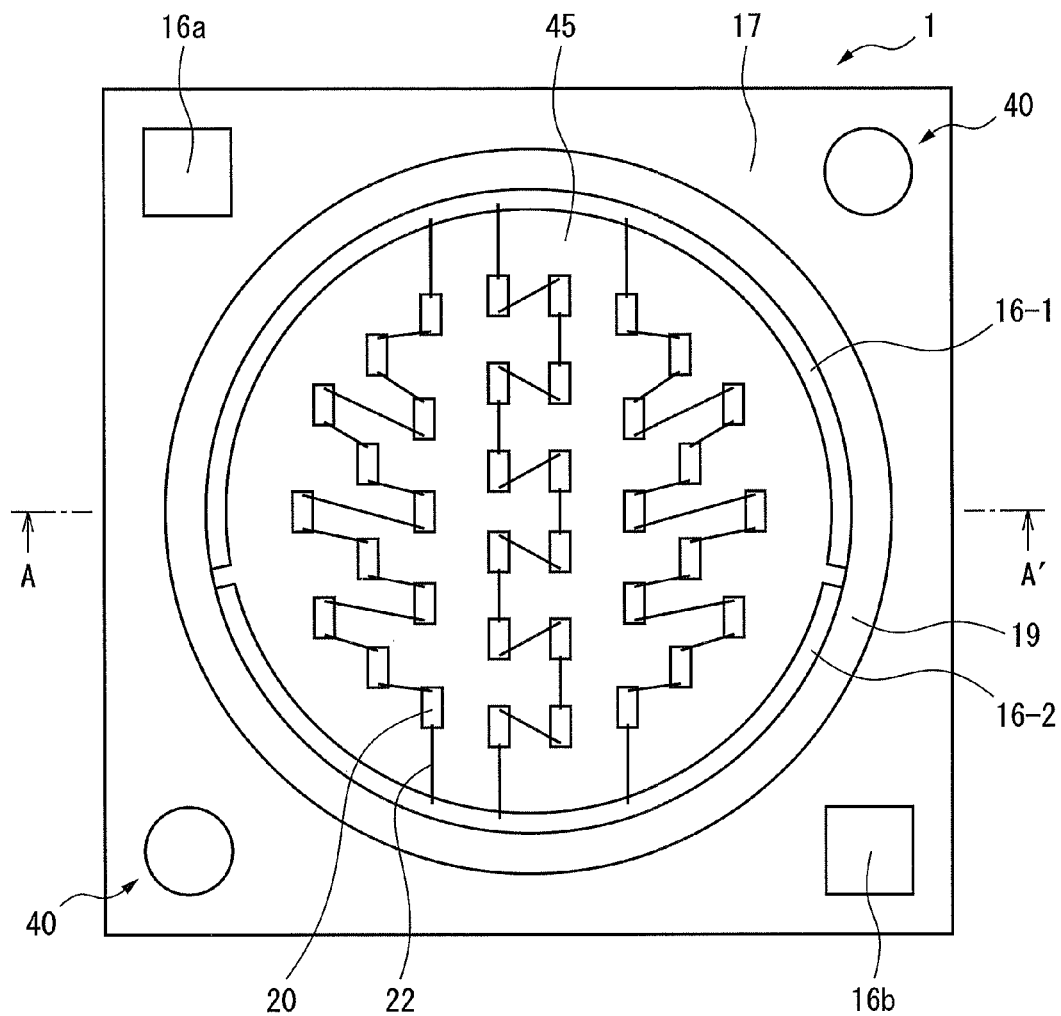
FIG. 1A is a top plan view of an LED lighting apparatus 1 according to the present invention.
Figure 1B:
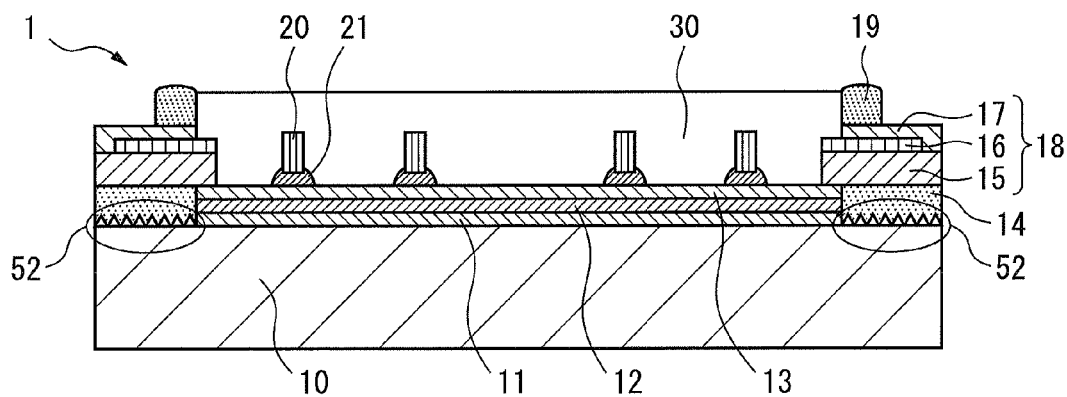
FIG. 1B is a cross-sectional view taken along line AA' in FIG. 1A.

FIG. 1A is a top plan view of the LED lighting apparatus 1 according to the present invention, and FIG. 1B is a cross-sectional view taken along line AA' in FIG. 1A.

The LED lighting apparatus 1 comprises an aluminum substrate 10, a printed wiring substrate 18, a frame member 19, LED devices 20, and a phosphor resin 30, and is installed to a lighting fixture by means of guiding holes 40 provided in edge portions.

In a device mounting region 45 enclosed by the frame member 19 formed in a substantially circular shape by depositing a silicone resin, there are formed an adhesive layer 11, a reflective layer 12, and an enhanced reflectivity layer 13 one on top of another on the aluminum substrate 10 for enhanced reflection.

The adhesive layer 11 is an anodized aluminum layer. The reflective layer 12 is an Ag or Al deposited layer whose reflectivity is 90% or higher. The enhanced reflectivity layer 13 is formed from a stack of at least one $SiO_2$ layer and at least one $TiO_2$ layer having a greater refractive index than $SiO_2$. A stack of an $Al_2O_3$ layer and a $TiO_2$ layer having a greater refractive index than $Al_2O_3$ may be used instead of the stack of the $SiO_2$ and $TiO_2$ layers. The enhanced reflectivity layer 13 is provided in order to enhance reflectivity.

In the device mounting region 45, the LED devices 20 arranged in three groups, each of 12 LED devices connected in series, are connected in parallel by gold wires 22 between electrodes 16-1 and 16-2 formed on the printed wiring substrate 18. Each LED device 20 is bonded by a die bonding material 21 directly to the reflectivity-enhanced surface of the aluminum substrate 10. The LED device 20 emits light when a prescribed voltage is applied between the electrodes 16a and 16b formed on the printed wiring substrate 18.

The phosphor resin 30 for protecting the LED devices 20 is formed inside the frame member 19 so as to enclose the LED devices 20. A transparent epoxy resin or silicone resin is used to form the phosphor resin 30. The phosphor resin 30 contains phosphors dispersed through the resin. Since the phosphors absorb a portion of the blue light emitted from the LED devices 20 and produce yellow light by wavelength conversion, the LED lighting apparatus 1 emits white light with the yellow light mixing with the blue light. The phosphor resin 30 may also contain a diffusing material for uniformly diffusing the light emitted from the LED devices 20.

A roughened surface region 46 not treated for enhanced reflection but treated by roughening the aluminum surface is formed on the aluminum substrate 10 so as to surround the device mounting region 45. The printed wiring substrate 18 is bonded on the roughened surface region 46 by means of an adhesive sheet 14. The printed wiring substrate 18 includes a base 15 and a resist 17 in addition to the electrodes 16-1, 16-2, etc.

In the device mounting region 45 treated for enhanced reflection with the plurality of layers, the adhesion between the layers is insufficient; therefore, if the printed wiring substrate 18 is bonded on this region, the printed wiring substrate 18 may become delaminated from the aluminum substrate 10 due to interlayer delamination. Furthermore, when the aluminum substrate is subjected to thermal expansion or shrinkage due to changes in ambient temperature, interlayer delamination may also occur, causing the printed wiring substrate 18 to delaminate from the aluminum substrate 10. By contrast, in the LED lighting apparatus 1, since the printed wiring substrate 18 is bonded, not on the device mounting region 45 treated for enhanced reflection, but on the roughened surface region 46 by using the adhesive sheet 14, the printed wiring substrate 18 can be firmly bonded to the aluminum substrate 10. Furthermore, since the printed wiring substrate 18 does not become delaminated from the aluminum substrate 10 due to the thermal history given to the LED lighting apparatus 1 when, for example, installing the LED lighting apparatus 1 to a lighting fixture, it becomes possible to manufacture a package with high reliability.

FIGS. 2 and 3 are diagrams for explaining a manufacturing process for the LED lighting apparatus 1.

Figure 2A:
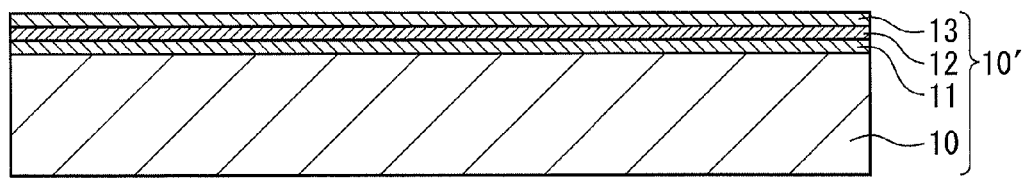
FIG. 2A is a diagram (part 1) for explaining a manufacturing process for the LED lighting apparatus 1.

First, as shown in FIG. 2A, a reflectivity-enhanced aluminum plate 10' is prepared. In this example, Miro 20.7t manufactured by Anorad was used as the reflectivity-enhanced aluminum plate 10'. The reflectivity-enhanced aluminum plate 10' has a multilayered structure in which the adhesive layer 11 of anodized aluminum, the reflective layer 12 of an Al deposited film, and the enhanced reflectivity layer 13 formed from a stack of $SiO_2$ and $TiO_2$ layers (at least one each) are deposited one on top of another on the aluminum substrate 10. If the reflective layer 12 is formed from an Ag deposited film, the reflectivity will improve, but since it is susceptible to corrosion, an Al deposited film is used here.

Figure 2B:
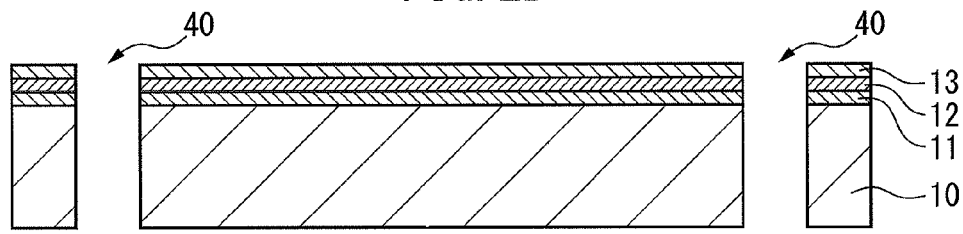
FIG. 2B is a diagram (part 1) for explaining a manufacturing process for the LED lighting apparatus 1.

Next, as shown in FIG. 2B, the guiding holes 40 are opened through the aluminum plate 10' by using a drilling machine.

Figure 2C:
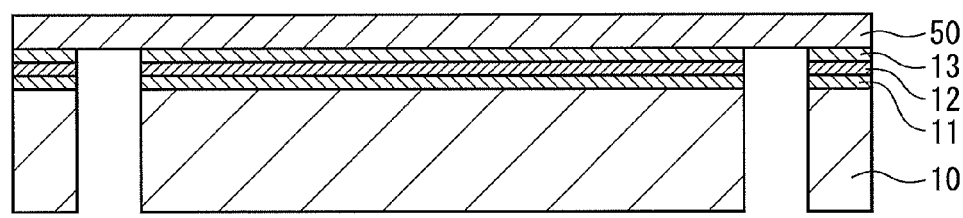
FIG. 2C is a diagram (part 1) for explaining a manufacturing process for the LED lighting apparatus 1.

Next, as shown in FIG. 2C, a photosensitive dry film 50 is laminated to the surface of the aluminum plate 10' by using a laminator. In this example, an alkaline-developing dry film "PHOTEC (registered trademark) H-7025" manufactured by Hitachi Chemical was used as the photosensitive dry film 50.

Figure 2D:
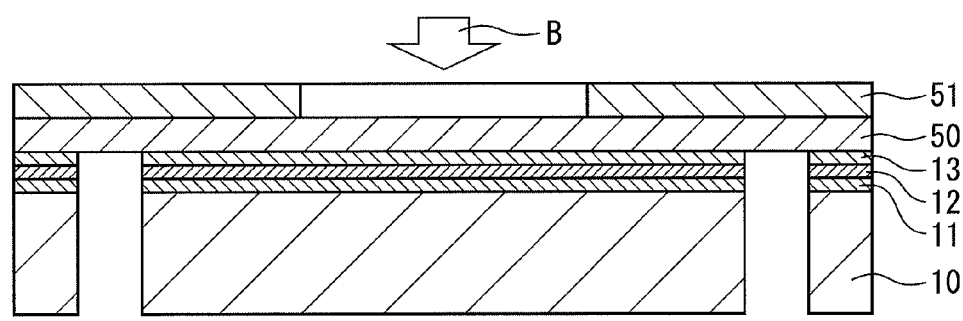
FIG. 2D is a diagram (part 1) for explaining a manufacturing process for the LED lighting apparatus 1.
Figure 2E:
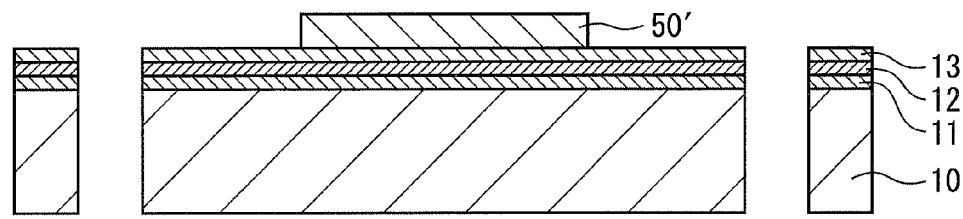
FIG. 2E is a diagram (part 1) for explaining a manufacturing process for the LED lighting apparatus 1.

Next, as shown in FIG. 2D, a negative film 51 for masking the device mounting region 45 is laminated by a vacuum onto the photosensitive dry film 50, and is exposed to ultraviolet radiation B to cure only the portion of the photosensitive dry film 50 that masks the device mounting region 45. Then, as shown in FIG. 2E, the exposed photosensitive dry film 50 is developed using a developing solution, thus forming a mask 50' on the device mounting region 45. A 1% alkaline solution was used as the developing solution.

In the steps shown in FIGS. 2D and 2E, the mask 50' has been formed by wet processing which involves developing the photosensitive dry film 50. Alternatively, a rubber-based ink such as a strippable solder resist (peel coat) may be applied over the device mounting region 45 by screen printing, and then thermally cured to form the mask 50'.

Next, as shown in FIG. 3A, particles C are sprayed at high speed by sand blasting, thereby removing the portions of the adhesive layer 11, reflective layer 12, and enhanced reflectivity layer 13 that lie outside the region covered by the mask 50', and the exposed surface of the aluminum substrate 10 is roughened to form the roughened surface region 46. In the step shown in FIG. 3A, ice blasting which uses ice particles may be employed instead of sand blasting. Ice blasting is preferable to sand blasting, because the latter tends to leave a residue.

In the step shown in FIG. 3A, the roughened surface region 46 has been formed by a physical means such as sand blasting (or ice blasting), but the roughened surface region 46 may be formed chemically by using an etching solution of sulfuric acid or hydrochloric acid. When chemically forming the roughened surface region 46, it is desirable to laminate the photosensitive dry film 50 on both sides of the aluminum plate 10'. Further, instead of using the physical means, the roughened surface region 46 may be formed electrically by plasma processing.

Next, as shown in FIG. 3B, the mask 50' is removed by using an alkaline solution.

Next, as shown in FIG. 3C, the printed wiring substrate 18 with the adhesive sheet 14 tentatively attached thereto is registered with respect to the aluminum substrate 10, and is laminated to the roughened surface region 46 under prescribed temperature and pressure. The printed wiring substrate 18, before lamination, comprises the base 15, the electrodes 16-1, 16-2, etc., and the resist 17, and guiding holes about the same size as the guiding holes formed in the aluminum plate 10' are formed in respectively corresponding positions. Next, using the die bonding material 21, each LED device 20 is bonded on the device mounting region 45. Then, the LED devices 20 are connected to each other as well as to the electrodes 16-1 and 16-2 by using the gold wires 22.

Next, as shown in FIG. 3D, using a dispenser, a silicone resin is deposited in a substantially circular shape around the device mounting region 45 and cured to form the frame member 19. The height of the frame member 19 is preferably in the range of 100 μm to 600 μm. Next, using a dispenser, the phosphor resin 30 is deposited inside the frame member 19 and cured to complete the manufacturing of the LED lighting apparatus 1. A transparent silicone resin may be molded over the phosphor resin 30.

FIG. 4 is a diagram for explaining a manufacturing method of another LED lighting apparatus 2.

Figure 4A:
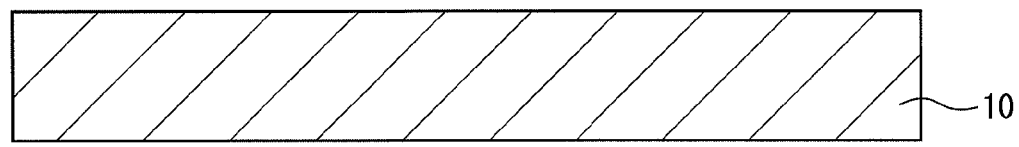
FIG. 4A is a diagram for explaining a manufacturing method of another LED lighting apparatus 2.

First, as shown in FIG. 4A, an aluminum substrate 10 not treated for enhanced reflection is prepared. In this example, a general-purpose aluminum alloy 55052-01.2t available from Sumitomo Light Metal Industries was used to form the aluminum substrate 10.

Figure 4B:
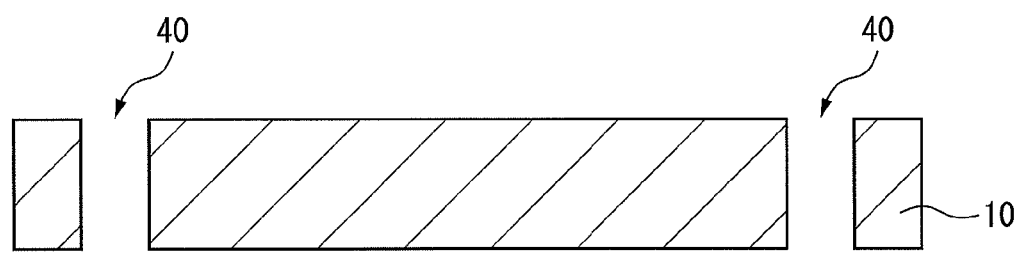
FIG. 4B is a diagram for explaining a manufacturing method of another LED lighting apparatus 2.

Next, as shown in FIG. 4B, the guiding holes 40 are opened through the aluminum substrate 10 by using a drilling machine.

Figure 4C:
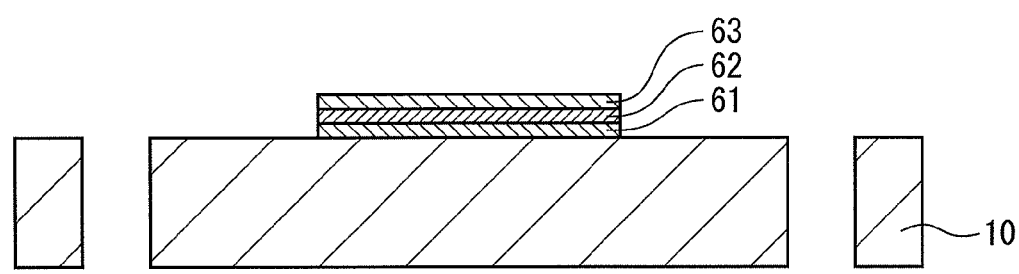
FIG. 4C is a diagram for explaining a manufacturing method of another LED lighting apparatus 2.

Next, as shown in FIG. 4C, an adhesive layer 61 of anodized aluminum, a reflective layer 62 of an Ag deposited film, and an enhanced reflectivity layer 63 formed from a stack of $SiO_2$ and $TiO_2$ layers (at least one each) are deposited one on top of another only on a region corresponding to the device mounting region 45.

Figure 4D:
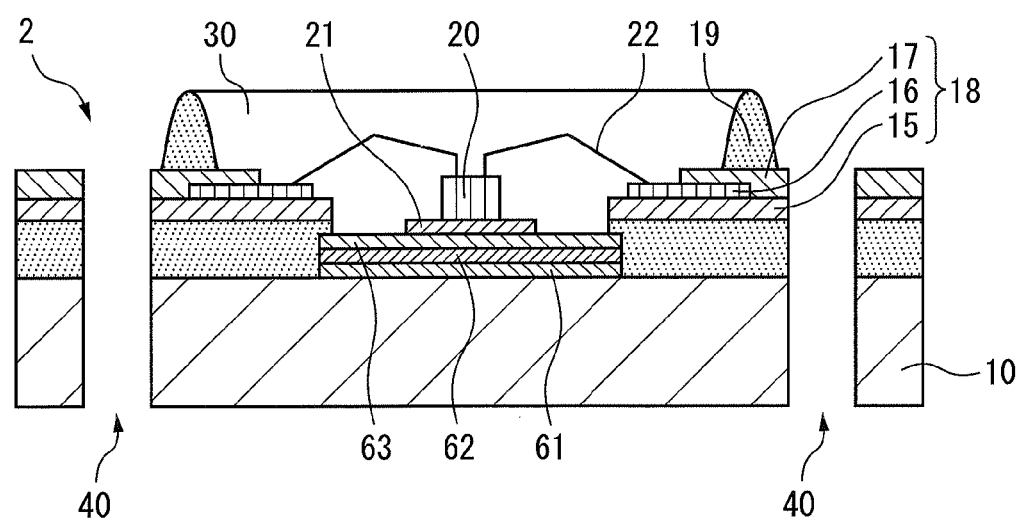
FIG. 4D is a diagram for explaining a manufacturing method of another LED lighting apparatus 2.

Next, as shown in FIG. 4D, the printed wiring substrate 18 with the adhesive sheet 14 tentatively attached thereto is registered with respect to the aluminum substrate 10, and is laminated under prescribed temperature and pressure to the region where the stack of the adhesive layer 61, reflective layer 62, and enhanced reflectivity layer 63 is not formed. The printed wiring substrate 18, before lamination, comprises the base 15, the electrodes 16-1, 16-2, etc., and the resist 17, and guiding holes about the same size as the guiding holes formed in the aluminum plate 10' are formed in respectively corresponding positions. Next, using the die bonding material 21, each LED device 20 is bonded on the device mounting region 45. Then, the LED devices 20 are connected to each other as well as to the electrodes 16-1 and 16-2 by using the gold wires 22.

Next, using a dispenser, a silicone resin is deposited in a substantially circular shape around the device mounting region 45 and cured to form the frame member 19. The height of the frame member 19 is preferably in the range of 100 μm to 600 μm. Next, using a dispenser, the phosphor resin 30 is deposited inside the frame member 19 and cured to complete the manufacturing of the LED lighting apparatus 2. A transparent silicone resin may be molded over the phosphor resin 30.

The only difference between the LED lighting apparatus 1 shown in FIGS. 1 to 3 and the LED lighting apparatus 2 shown in FIG. 4D is the presence or absence of the roughened surface region 46, which is present in the LED lighting apparatus 1 but is absent in the LED lighting apparatus 2 which instead has the untreated surface of the aluminum substrate 10 exposed.

In the LED lighting apparatus 2 also, since the printed wiring substrate 18 is bonded, not on the device mounting region 45 treated for enhanced reflection, but on the surface of the aluminum substrate 10 by using the adhesive sheet 14, the printed wiring substrate 18 can be firmly bonded to the aluminum substrate 10. Furthermore, since the printed wiring substrate 18 do not delaminate from the aluminum substrate 10 due to the thermal history given to the LED lighting apparatus 2 when, for example, installing the LED lighting apparatus 2 to a lighting fixture, it is possible to manufacture a package with high reliability.

The preceding description only illustrates and describes exemplary embodiments of the present lighting apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode contemplated for carrying out this invention, but the invention will include all embodiments falling within the scope of the claims. The invention may be practiced otherwise than is specifically explained and illustrated without departing from its spirit or scope.

What is claimed is:

1. An LED lighting apparatus comprising:
   an aluminum substrate;
   a device mounting region formed on said aluminum substrate, wherein said device mounting region includes an adhesive layer, a reflective layer, and an enhanced reflectivity layer;
   an LED device bonded on said device mounting region;
   a roughened surface region formed on said aluminum substrate, wherein said roughened surface region is located other than a region where said device mounting region is formed;
   a printed wiring substrate bonded onto said roughened surface region;
   a wire for connecting between said printed wiring substrate and said LED device;
   a frame member formed so as to surround said LED device; and
   a phosphor resin deposited over a region inside said frame member.

2. The LED lighting apparatus according to claim 1, wherein said enhanced reflectivity layer includes $SiO_2$, $TiO_2$, or $Al_2O_3$.

* * * * *